(12) United States Patent
Borland et al.

(10) Patent No.: US 7,701,052 B2
(45) Date of Patent: Apr. 20, 2010

(54) POWER CORE DEVICES

(75) Inventors: William J. Borland, Cary, NC (US); Saul Ferguson, Durham, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 220 days.

(21) Appl. No.: 11/514,094

(22) Filed: Aug. 31, 2006

(65) Prior Publication Data

US 2007/0090511 A1   Apr. 26, 2007

Related U.S. Application Data

(60) Provisional application No. 60/729,275, filed on Oct. 21, 2005.

(51) Int. Cl.
- *H01L 23/538* (2006.01)
- *H01L 23/12* (2006.01)
- *H01L 23/053* (2006.01)

(52) U.S. Cl. ............... 257/700; 257/691; 257/781; 257/E23.175

(58) Field of Classification Search ............... 257/499, 257/500, 501, 516, 532, 528, 691, 700; 361/321; 29/25.03; 174/262
See application file for complete search history.

(56) References Cited

U.S. PATENT DOCUMENTS

| | | | |
|---|---|---|---|
| 5,027,253 A * | 6/1991 | Lauffer et al. | 361/321.4 |
| 5,161,086 A | 11/1992 | Howard et al. | |
| 6,239,485 B1 * | 5/2001 | Peters et al. | 257/700 |
| 6,524,352 B2 * | 2/2003 | Adae-Amoakoh et al. | 29/25.03 |
| 6,611,419 B1 | 8/2003 | Chakravorty | |
| 6,955,948 B2 * | 10/2005 | Asahi et al. | 438/125 |
| 6,979,897 B2 * | 12/2005 | Ma | 257/691 |
| 7,095,117 B2 * | 8/2006 | Suwa et al. | 257/738 |
| 7,442,879 B2 * | 10/2008 | Das et al. | 174/262 |
| 2002/0076919 A1 * | 6/2002 | Peters et al. | 438/637 |
| 2002/0166697 A1 * | 11/2002 | Janecek et al. | 174/262 |
| 2004/0107569 A1 * | 6/2004 | Guzek et al. | 29/846 |
| 2004/0238949 A1 * | 12/2004 | Iijima et al. | 257/728 |
| 2006/0133057 A1 | 6/2006 | McGregor et al. | |
| 2006/0138591 A1 * | 6/2006 | Amey et al. | 257/532 |
| 2006/0151202 A1 * | 7/2006 | Das et al. | 174/256 |
| 2006/0154434 A1 * | 7/2006 | Das et al. | 438/393 |
| 2006/0158828 A1 | 7/2006 | Amey, Jr. et al. | |
| 2006/0215380 A1 * | 9/2006 | Lu et al. | 361/763 |

* cited by examiner

*Primary Examiner*—Leonardo Andújar
*Assistant Examiner*—William Harriston

(57) ABSTRACT

A device comprising a power core wherein said power core comprises: at least one embedded singulated capacitor layer containing at least one embedded singulated capacitor wherein said embedded singulated capacitor comprises at least a first electrode and a second electrode and wherein said embedded singulated capacitor is positioned on the outer layer of the power core with both first and second electrodes of the capacitor on the outer layer of the power core so that at least one Vcc (power) terminal and at least one Vss (ground) terminal of a semiconductor device can be directly connected to at least one first and at least one second electrode, respectively.

7 Claims, 12 Drawing Sheets

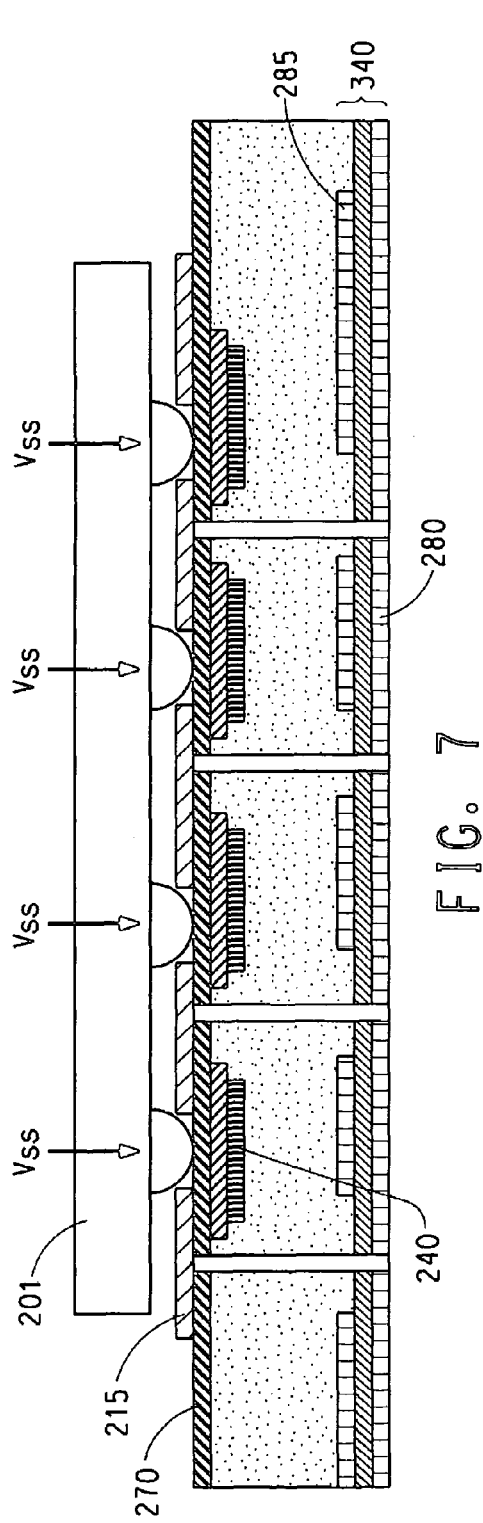
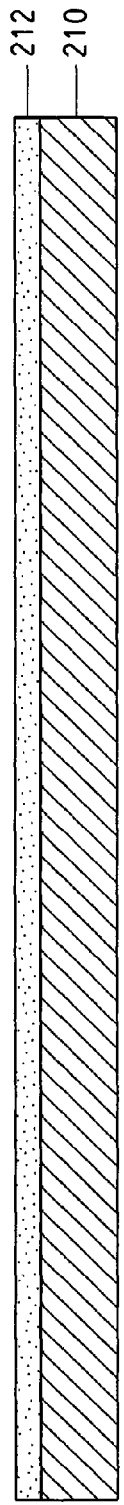
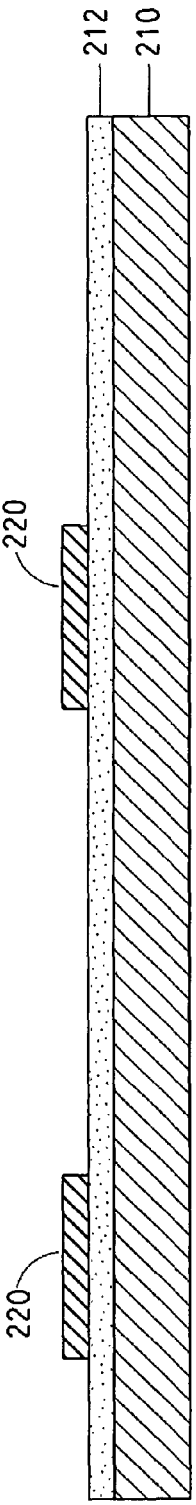
FIG. 7
FIG. 8A
FIG. 8B

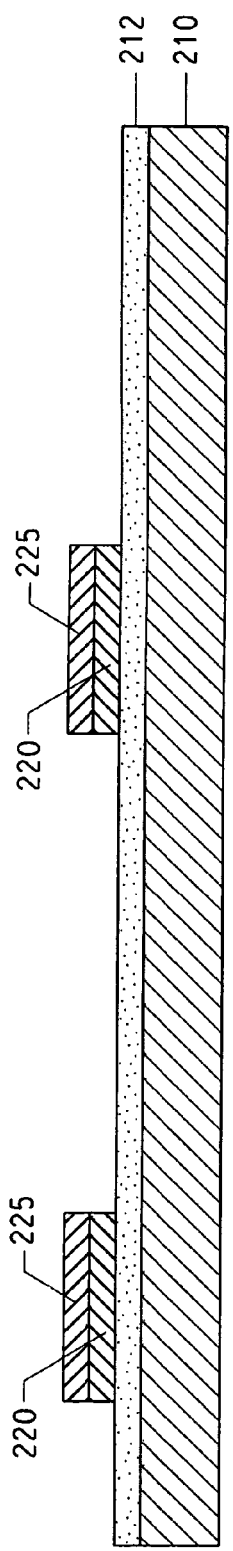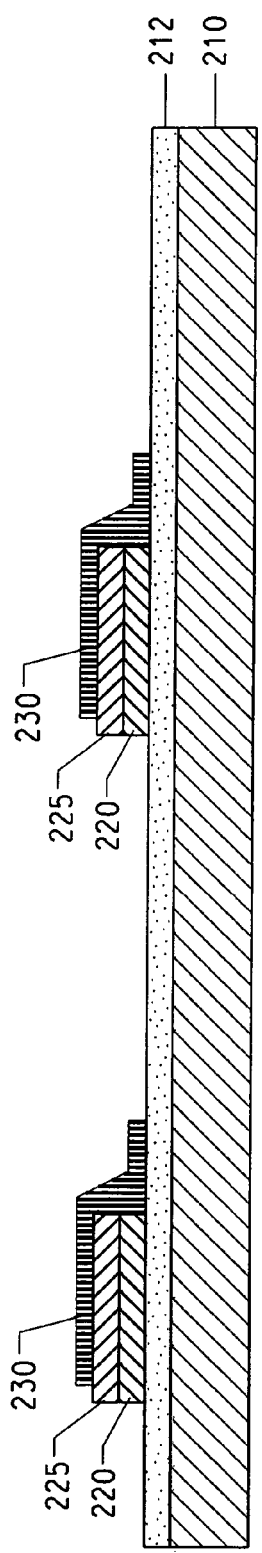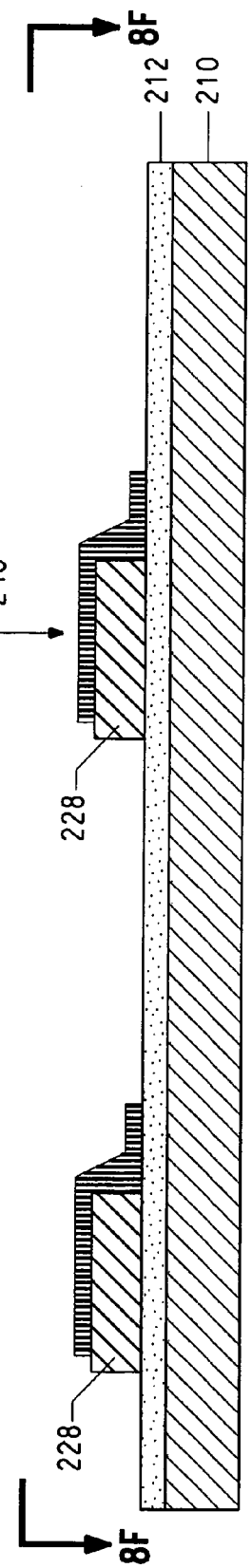

POWER CORE DEVICES

FIELD OF THE INVENTION

The technical field relates to devices having both low inductance and high capacitance functions, and methods of incorporating such devices in power core packages, including organic dielectric laminates and printed wiring boards.

BACKGROUND OF THE INVENTION

As semiconductor devices including integrated circuits (IC) operate at higher frequencies, higher data rates and lower voltages, managing noise in the power and ground (return) lines and supplying sufficient current to accommodate faster circuit switching become increasingly important problems requiring low impedance in the power distribution system. In order to provide low-noise and stable power to the IC, impedance in conventional circuits is reduced by the use of additional surface mount capacitors interconnected in parallel. The higher operating frequencies (higher IC switching speeds) mean that voltage response times to the IC must be faster. Lower operating voltages require that allowable voltage variations (ripple) and noise become smaller. For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin and the IC will malfunction. Additionally, as the IC powers up, a slow response time will result in power overshoot. Power droop and overshoot must be controlled within allowable limits by the use of capacitors that are close enough to the IC that they provide or absorb power within the appropriate response time.

Surface Mount Technology (SMT) capacitors for impedance reduction and dampening power droop or overshoot are generally placed as close to the IC as possible to improve circuit performance. Conventional designs have capacitors surface mounted on a printed wiring board (PWB) clustered around the IC. Large value capacitors are placed near the power supply, mid-range value capacitors at locations between the IC and the power supply and small value capacitors very near the IC. FIG. 1 is a schematic illustration of a power supply, an IC and the capacitors 4, 6, 8, which represent high value, mid-range value and small value capacitors, respectively, used for impedance reduction and dampening power droop or overshoot as described above. FIG. 2 is a representative section view in front elevation showing the connections of the SMT capacitors 50 and 60 and IC 40 to the power and ground planes in the substrate of the PWB. IC device 40 is connected to lands 41 by solder filets 44. Lands 41 are connected to plated-through hole via (via) pads of vias 90 and 100 by circuit lines 72 and 73. Via pads are shown generically as 82. Via 90 is electrically connected to conductor plane 120 and via 100 is connected to conductor plane 122. Conductor planes 120 and 122 are connected one to the power side of the power supply and the other to the ground side of the power supply. Small value capacitors 50 and 60 are similarly electrically connected to vias and conductor planes 120 and 122 in such a way that they are electrically connected to IC 40 in parallel. In the case of ICs placed on modules, interposers, or packages, the large and medium value capacitors may reside on the printed wiring mother board to which the modules, interposers, or packages are attached.

Large numbers of capacitors, interconnected in parallel, are often required to reduce power system impedance requiring complex electrical routing. This leads to increased circuit loop inductance, which in turn increases impedance, constraining current flow, thereby reducing the beneficial effects of the surface mounted capacitors. As frequencies increase and operating voltages continue to drop, increased power must be supplied at faster rates requiring increasingly lower inductance and impedance levels.

Considerable effort has been expended to minimize impedance. U.S. Pat. No. 5,161,086 to Howard, et al., provides one approach to minimizing impedance and "noise". Howard, et al., provides a capacitive printed circuit board with a capacitor laminate (planar capacitor) included within the multiple layers of the laminated board, a large number of devices such as integrated circuits being mounted or formed on the board and operatively coupled with the capacitor laminate (or multiple capacitor laminates) to provide a capacitive function employing borrowed or shared capacitance. However, such an approach does not necessarily improve voltage response. Improved voltage response requires that the capacitor is placed closer to the IC. Simply placing the capacitor laminate closer to the IC may not be sufficient because the total capacitance available may be insufficient.

U.S. Pat. No. 6,611,419 to Chakravorty provides for an alternate approach to embedding capacitors to reduce switching noise wherein the power supply terminals of an integrated circuit die can be coupled to the respective terminals of at least one embedded capacitor in a multilayer ceramic substrate.

Accordingly, the present inventors desired to provide a method of making and designing a power core for use in power core packages, which include use in integrated circuit packages or other interconnecting boards, structures, or elements, that allows for superior power distribution impedance reduction combined with improved voltage response to accommodate higher IC switching speeds. The present invention provides such a device and method of making such a device.

SUMMARY

The present invention is directed to a device comprising a power core wherein said power core comprises: at least one embedded singulated capacitor layer containing at least one embedded singulated capacitor wherein said embedded singulated capacitor comprises at least a first electrode and a second electrode and wherein said embedded singulated capacitor is positioned on the outer layer of the power core with both first and second electrodes of the capacitor on the outer layer of the power core so that at least one Vcc (power) terminal and at least one Vss (ground) terminal of a semiconductor device can be directly connected to at least one first and at least one second electrode, respectively.

The present invention is further directed to a method for making a device comprising: providing at least one planar capacitor having a patterned side and a non-patterned side; providing at least one foil structure comprising at least one formed-on-foil singulated capacitor having a foil side and a component side; and laminating said foil side of said formed-on-foil structure to said patterned side of said planar capacitor structure etching said foil side of said formed-on-foil structure and etching said non-patterned side of said planar capacitor structure forming a power core; and forming at least one signal layer as part of said power core.

In one embodiment, the signal layers noted above are formed by applying a dielectric layer to the planar capacitor surface of said power core; forming circuitry comprising one or more signal lines on said dielectric layer; and forming a conductive interconnection between layers comprising said signal lines. The interconnections between layers may be a conductive via.

BRIEF DESCRIPTION OF THE DRAWINGS

The detailed description will refer to the following drawings, wherein like numerals refer to like elements, and wherein:

FIG. 7 is a representation in section view across line c-c in front elevation of a portion of a power core device according to the first embodiment.

FIGS. 8A-8F illustrate a method of making singulated thick-film fired-on-foil capacitors.

DETAILED DESCRIPTION

According to a first embodiment, a design and manufacturing method of a power core device is disclosed in which singulated capacitors with electrodes on the outer layer and planar capacitors are connected in parallel and embedded within a laminate structure to create a power core structure. The power core structure may be interconnected to at least one signal layer. Singulated capacitors may be defined as individual capacitors formed on metal. Typically, the metal is a metal foil. Although we use the term "foil" herein, it is understood that foil encompasses a general metal layer, plated metal, sputtered metal, etc. The singulated capacitors in the power core structure are designed to be on the outer layer of the device with the foil portion of the first electrode and the foil second electrode in the same plane on the outer layer so that the Vcc (power) terminals and the Vss (ground) terminals of the semiconductor device, such as a microprocessor, are aligned with and may be connected directly to the first and second electrodes of the singulated capacitor. The first and second electrode are in turn connected to the power and ground planes respectively of the embedded planar capacitor. The second electrodes of the singulated capacitors are common in the present embodiment but may also be separated. Placing the singulated capacitors on the outer layer with electrodes directly in contact with the power terminals of the microprocessor also provides for low inductance connections. The planar capacitor is used as the power-ground planes and the power-ground plane separation is made thin to reduce high frequency impedance in the package and to provide additional charge to the singulated capacitors.

Figure 1:
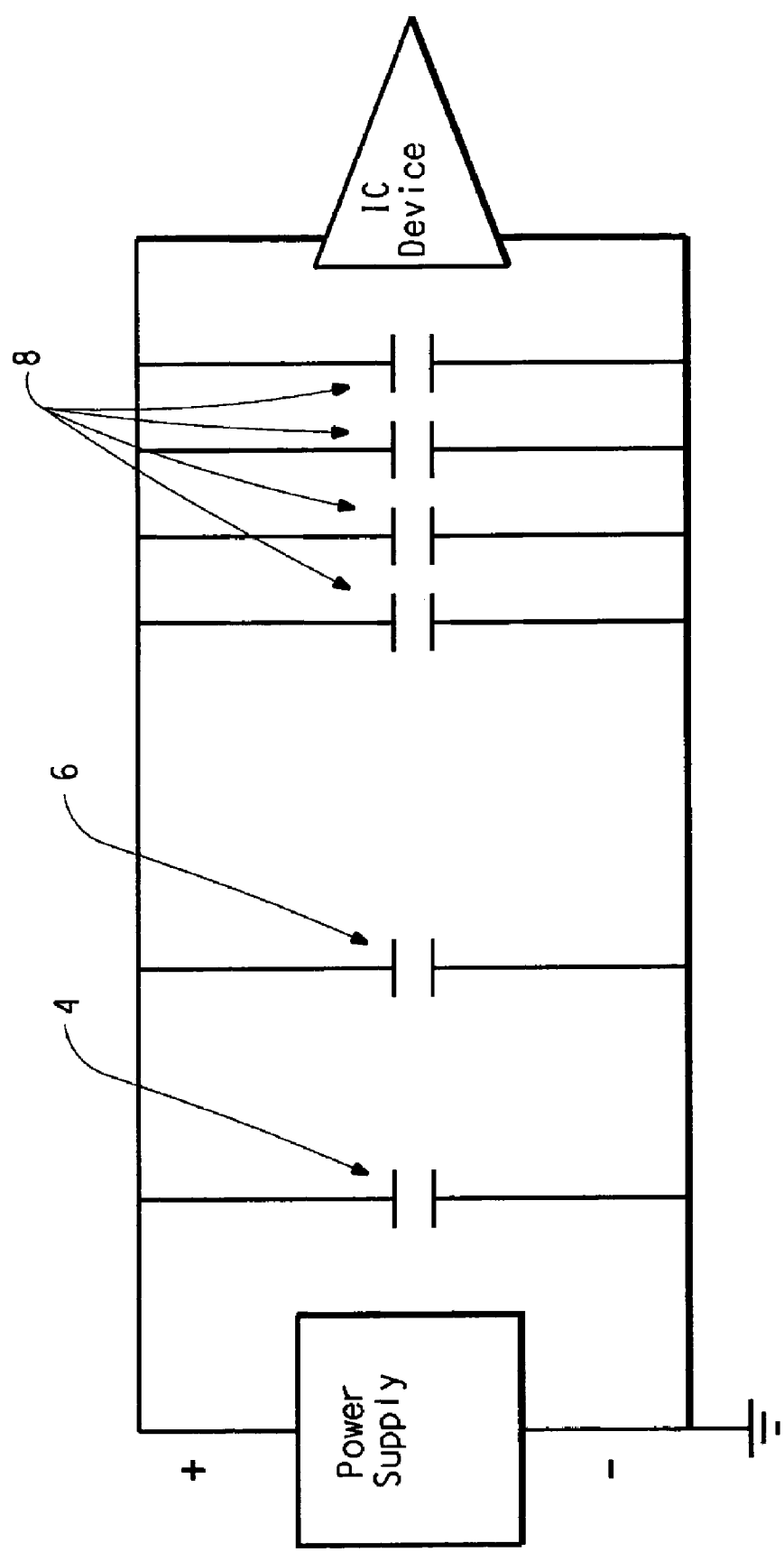
FIG. 1 is a schematic illustration of typical prior art use of capacitors for impedance reduction and dampening power droop or overshoot.
Figure 2:
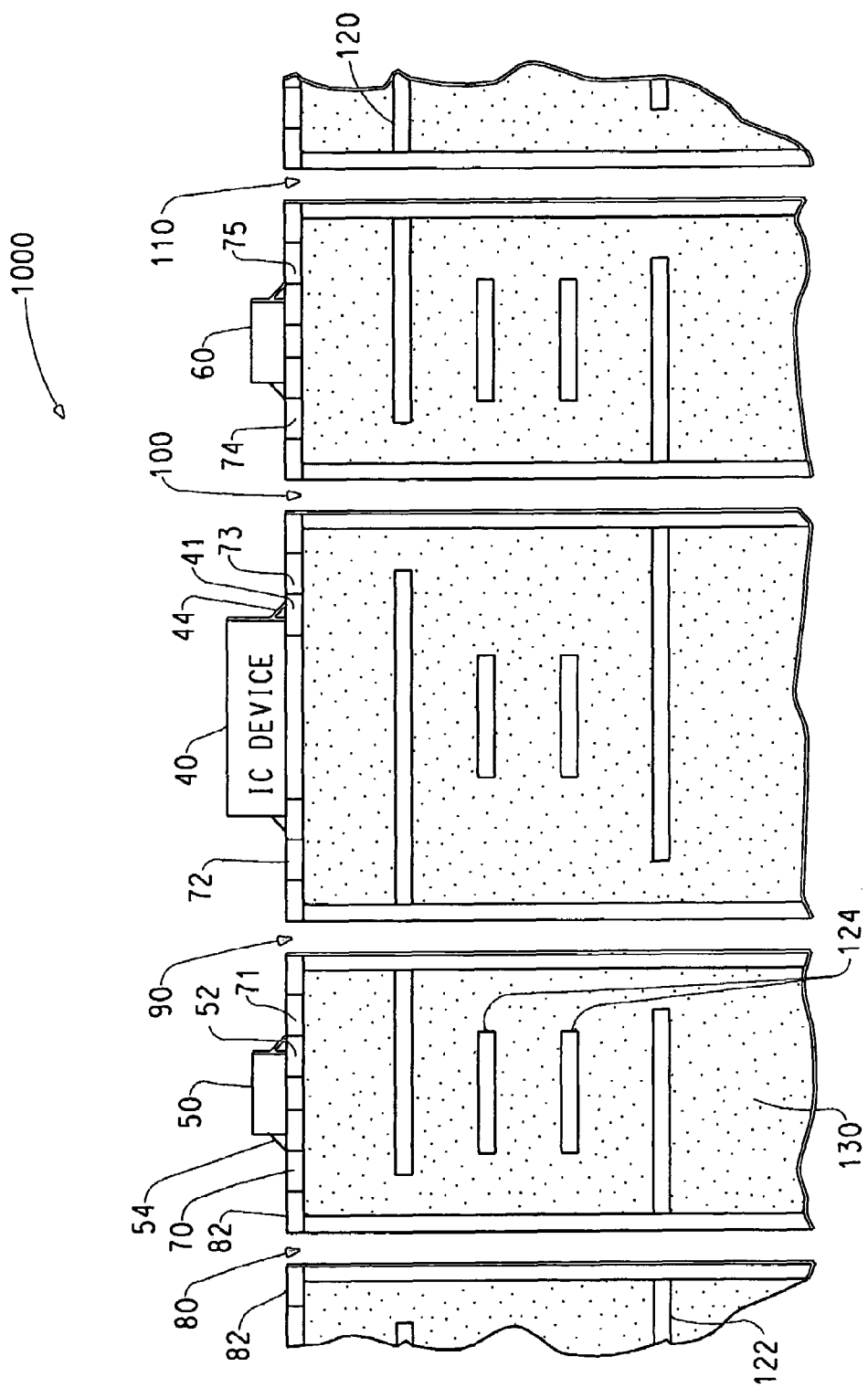
FIG. 2 is a representation in section view in front elevation of a printed wiring assembly having conventional prior art surface mount (SMT) capacitors used for impedance reduction and dampening power droop or overshoot.
Figure 3:
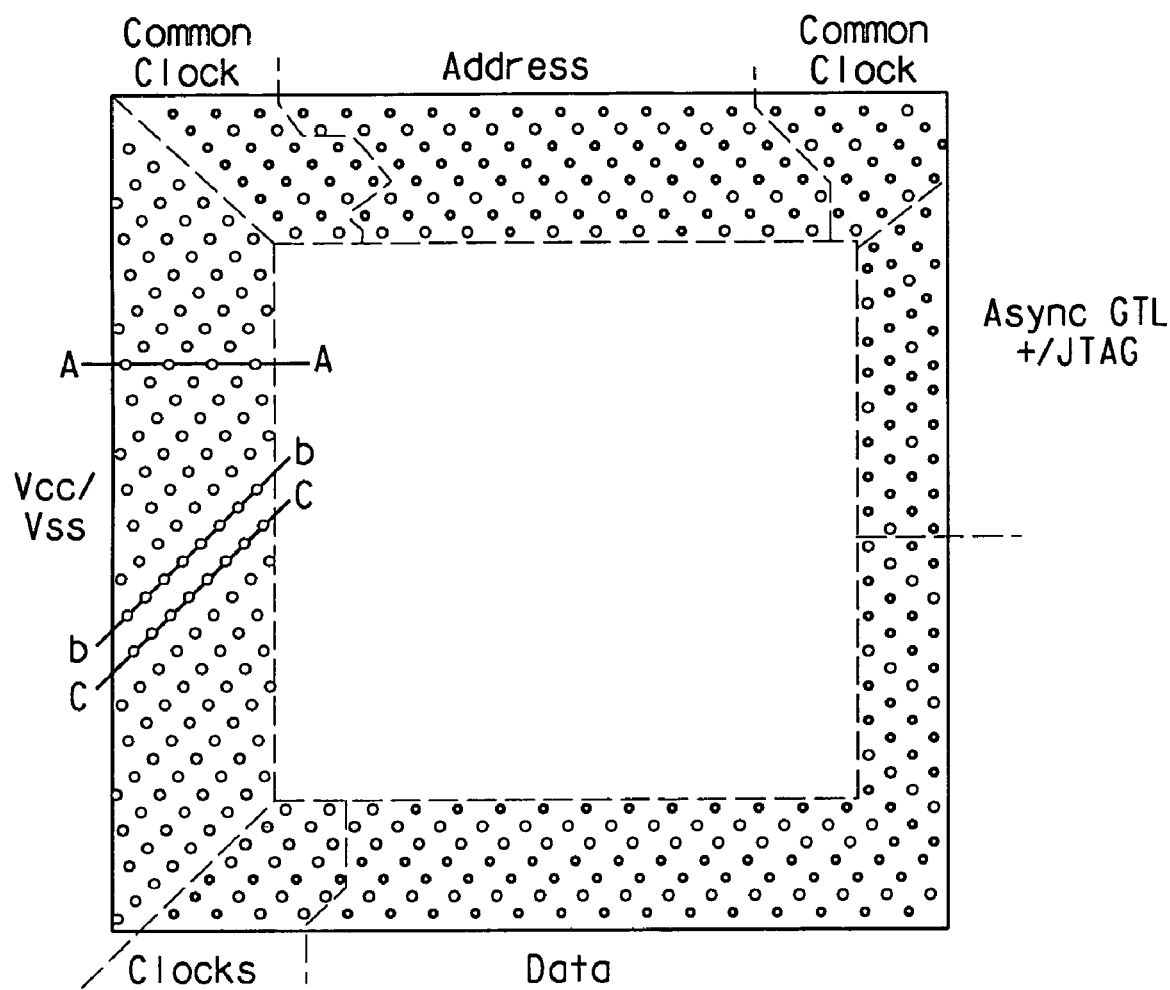
FIG. 3 shows the typical arrangement of Vcc (power) and Vss (ground) connections of the layout of a BGA assembly, such as a Pentium 4 processor package.

FIG. 3 shows the typical arrangement of Vcc (power) and Vss (ground) connections of the layout (mechanical arrangement of the connections to the printed wiring board) of a BGA assembly, such as a Pentium 4 processor package. The Vcc/Vss terminals are the area of focus for the power core.

Figure 4A:
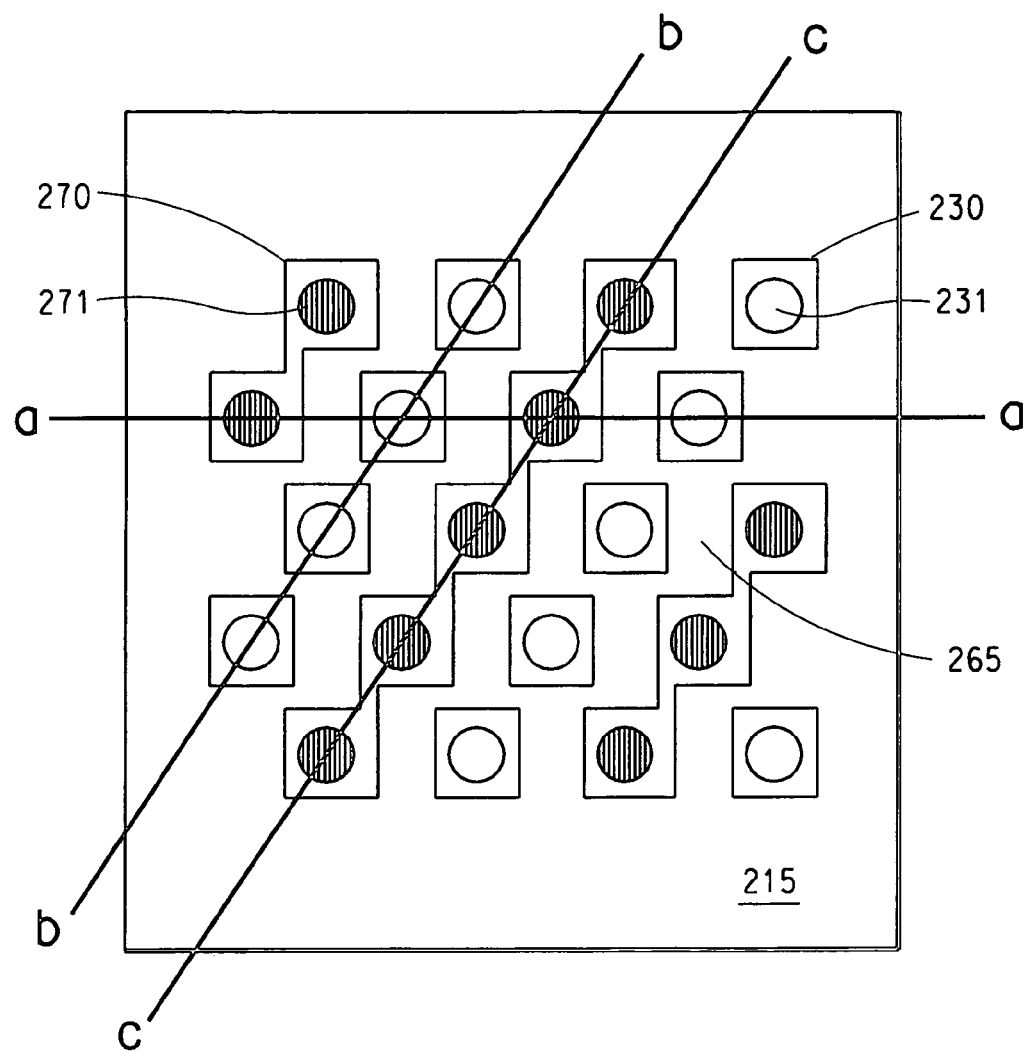
FIGS. 4A-B are plan views of a portion of the power core device according to the first embodiment showing how electrode pads and the dielectric of the singulated capacitors are aligned to the layout shown in FIG. 3

FIG. 4A shows a top plan view of the relevant portion of the power core device according to the present embodiment. Both the first electrode 230 and second electrode 270 of the singulated capacitors are outlined in FIG. 4A. Electrodes 230 and 270 are separated by the area 265 and are present on the surface of the power core device. The first electrodes 230 are designed to be connected directly to the Vcc (power) terminals of the processor package. The second electrodes 270 are designed to be connected directly to the Vss (ground) terminals of the processor package and are common. The size of the electrode pads 231 and 271 are defined by soldermask 215.

Figure 4B:
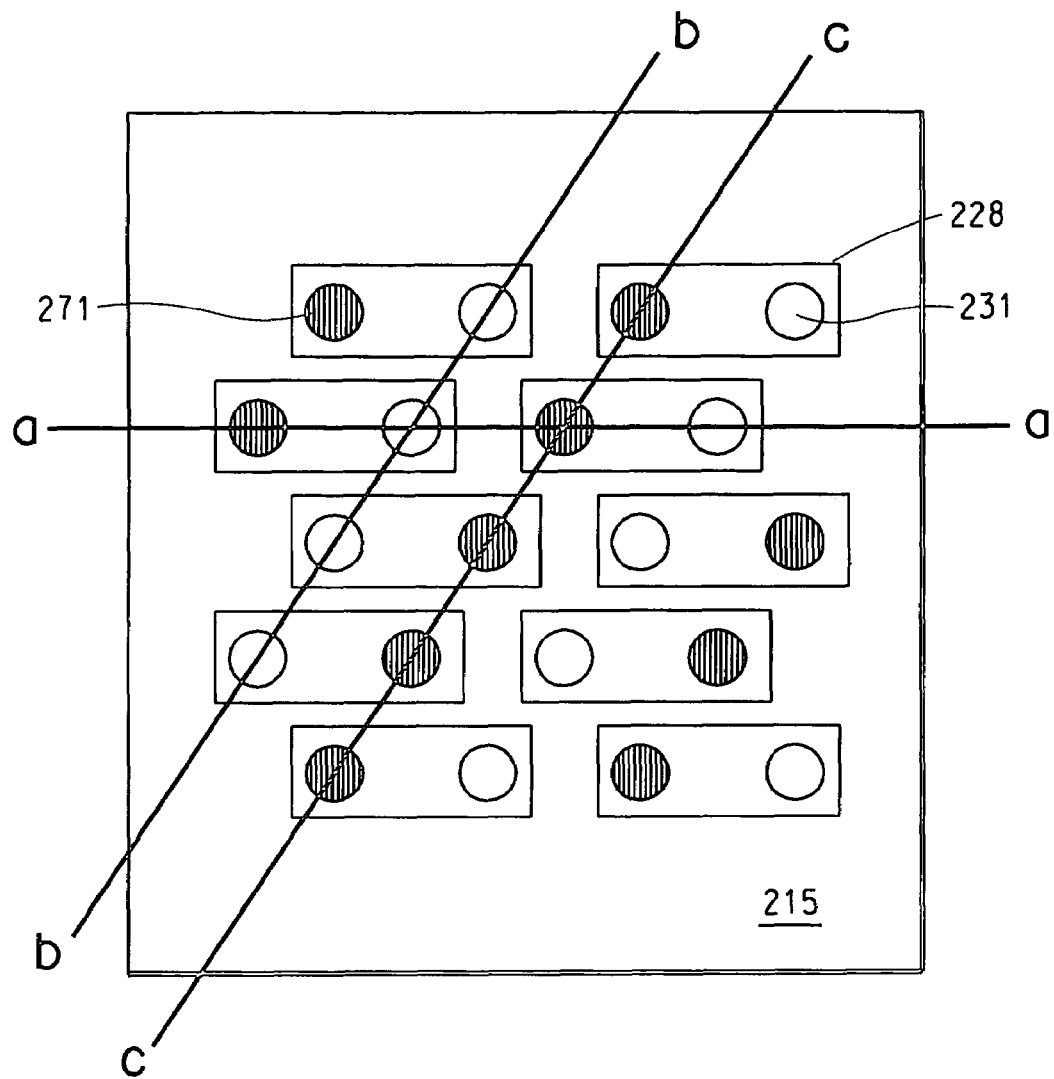

FIG. 4B is a top plan of the power core device showing the outline of the embedded dielectric 228 along with the soldermask defined electrode pads 231 and 271.

Figure 5:
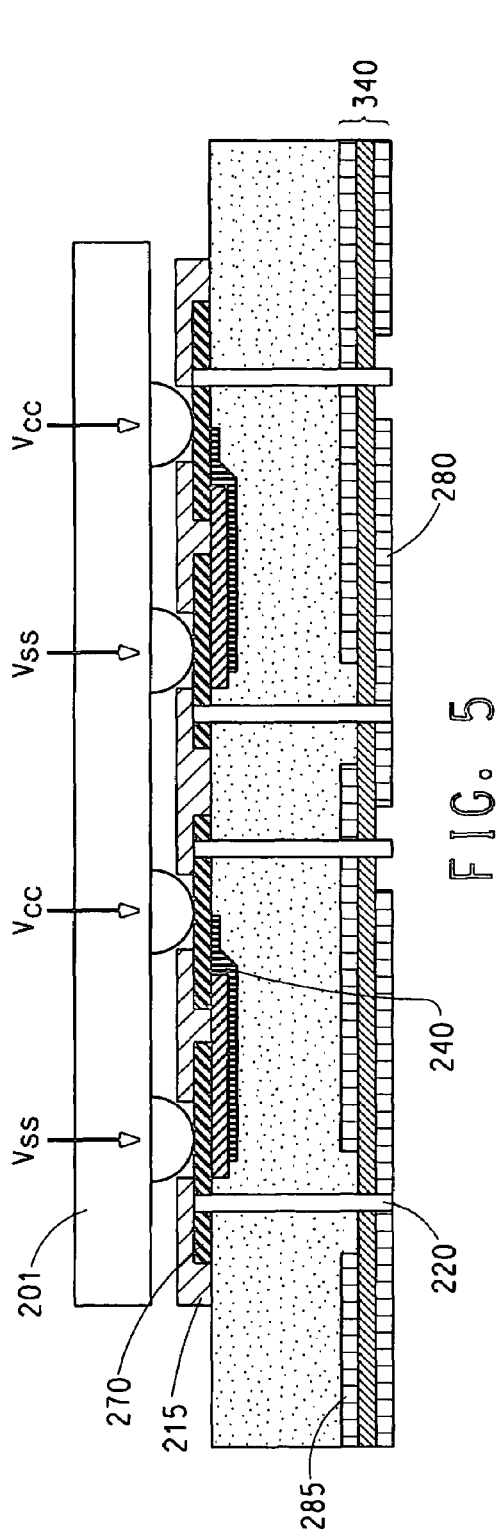
FIG. 5 is a representation in section view across line a-a in front elevation of a portion of a power core device according to the first embodiment.
Figure 6:
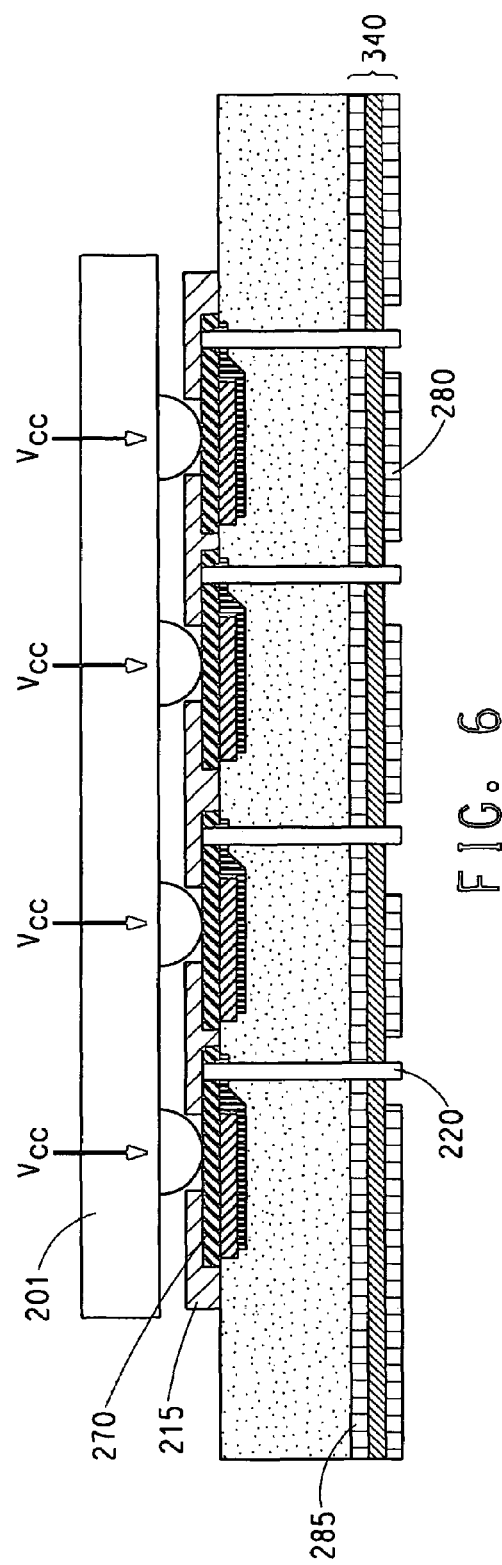
FIG. 6 is a representation in section view across line b-b in front elevation of a portion of a power core device according to the first embodiment.

FIGS. 5-7 are representations in section view in front elevation of the top portion of a power core structure along lines a-a, b-b, and c-c respectively. FIG. 5 is a representation in section view across line a-a in front elevation of a power core device with an attached semiconductor device, such as a microprocessor, according to the first embodiment. The Vcc (power) terminals of the semiconductor device 201 are connected to the soldermask defined pads 231 (shown in FIG. 4A) of the first electrodes 230 of the singulated capacitor which in turn are connected to the power plane 285 of the planar capacitor 340. The Vss (ground) terminals of the semiconductor device 201 are connected to the soldermask defined pads 271 (shown in FIG. 4A) of the second electrodes 270 of the singulated capacitor which in turn are connected to the ground plane 280 of the planar capacitor 340. FIG. 6 is a representation in section view across line b-b in front elevation of a power core device with an attached semiconductor device according to the first embodiment. The Vcc (power) terminals of the microprocessor 201 are connected to the soldermask defined pads 231 (shown in FIG. 4A) of the first electrodes 230 of the singulated capacitor which in turn are connected to the power plane 285 of the planar capacitor 340. FIG. 7 is a representation in section view across line c-c in front elevation of a power core device with an attached microprocessor according to a first embodiment. The Vss (ground) terminals of the semiconductor device 201 are connected to the soldermask defined pads 271 (shown in FIG. 4A) of the common second electrode 270 of the singulated capacitors which in turn is connected to the ground plane 280 of the planar capacitor.

The power core structure may be interconnected to at least one signal layer. The power core structure, therefore, may also have signal connection pads on its surface aligned with the semiconductor device signal terminals. The above power core allows for a foil containing the singulated capacitors to be formed with various materials and subsequently laminated to the planar capacitor to form the power core device. Such materials may include the use of a high K ceramic-filled polymer thick-film capacitor dielectric and a metal filled polymer thick-film electrode paste screen-printed and cured on to the metal foil. Etching of conventional planar capacitor laminates, such as copper/polyimide/copper laminates like Interra™ HK 04 obtainable from E. I. du Pont de Nemours and Company, may also be employed to form singulated capacitors on copper foil. Such capacitors made from polymer thick-film compositions or polymer planar capacitor laminates, however, have relatively low capacitance density and it is generally desirable that the singulated capacitors have a high capacitance density. In such a case, formed-on-foil techniques may be preferably employed to make singulated ceramic capacitors on copper foil using ceramic compositions and fired at relatively high temperatures to form a sintered ceramic capacitor. Such capacitors may be formed from thin-film or thick-film approaches. The foil containing said capacitors may be laminated to the planar capacitor using standard printed wiring board lamination processes to form the power core structure.

The above power core also allows for the planar capacitor to be formed using various materials. Such materials may include metal foil-dielectric-metal foil laminate structures wherein the dielectric may comprise an organic layer, a ceramic-filled organic layer, or a ceramic layer. Where multiple layers are used, layers may be of different materials. Such dielectrics would be manufactured as thin layers for impedance reduction. The planar capacitor may be laminated to the capacitors formed -on-foil by standard printing wiring board lamination processes to form the power core structure.

According to the above embodiment, both the low impedance and high capacitance functions may be integrated into a single power core structure that can be further integrated into another laminate structure, such as a printed wiring board, module, interposer, or package permitting operation of high-speed ICs at lower voltages with reduced voltage ripple. Further, solder joints associated with SMT devices may be eliminated, thereby improving reliability.

Those skilled in the art will appreciate the above stated advantages and other advantages and benefits of various embodiments of the invention upon reading the detailed description of the embodiments with reference to the figures listed above and detailed below.

According to common practice, the various features of the drawings are not necessarily drawn to scale. Dimensions of various features may be expanded or reduced to more clearly illustrate the embodiments of the invention.

Embodiments of the present invention are addressed to a power core structure that may be buried in the substrate of a printed wiring board (PWB), module, interposer, or package. Providing the low inductance and high capacitance functions of the power core within the PWB, module, interposer, or package substrate conserves valuable surface real estate on the PWB, module, interposer, or package and also requires fewer solder joints than conventional SMT capacitor arrangements.

FIGS. 8A-8E illustrate, in side elevation, a general method of manufacturing single-layer formed-on-foil singulated capacitors (typically fired on foil). FIG. 8F is a plan view of the finished formed-on-foil capacitors. Specific examples of thick-film fired-on-foil capacitors are described below to illustrate one embodiment of the present invention.

FIG. 8A is a side elevational view of a first stage of manufacturing the singulated capacitor structure 200. In FIG. 8A, a metallic foil 210 is provided. The foil 210 may be of a type generally available in the industry. For example, the foil 210 may be copper, copper-invar-copper, invar, nickel, nickel-coated copper, or other metals that have melting points in excess of the firing temperature for thick-film pastes. Preferred foils include foils comprised predominantly of copper, such as reverse treated copper foils, double-treated copper foils, and other copper foils commonly used in the multilayer printed circuit board industry. The thickness of the foil 210 may be in the range of, for example, about 1-100 microns, preferably 3-75 microns, and most preferably 12-36 microns, corresponding to between about ⅓ oz and 1 oz copper foil. An example of a suitable foil is PLSP grade 1 ounce copper foil obtainable from Oak-Mitsui.

The foil 210 may be pretreated by applying an underprint 212 to the foil 210. The underprint 212 is a relatively thin layer applied to a component-side surface of the foil 210. In FIG. 8A, the underprint 212 is indicated as a surface coating on the foil 210. The underprint 212 adheres well to the metal foil 210 and to layers deposited over the underprint 212. The underprint 212 may be formed, for example, from a paste applied to the foil 210, and is then fired in an inert atmosphere at a temperature below the melting point of the foil 210. The paste may be printed as an open coating over the entire surface of the foil 210, or printed on selected areas of the foil 210. It is generally more economical to print the underprint paste over selected areas of the foil. When a copper foil 210 is used in conjunction with a copper underprint 212, glass in the copper underprint paste retards oxidative corrosion of the copper foil 210, and it may therefore be preferable to coat the entire surface of the foil 210 if oxygen-doped firing is utilized. An example of a suitable copper underprint is EP 320 available from E. I. du Pont de Nemours and Company.

In FIG. 8B, a capacitor dielectric material is screen-printed onto the pretreated foil 210, forming a first capacitor dielectric layer 220. The capacitor dielectric material may be, for example, a thick-film dielectric ink. The dielectric ink may be formed of, for example, a paste. An example of a suitable capacitor dielectric paste is EP 310 obtainable from E. I. du Pont de Nemours and Company. The first capacitor dielectric layer 220 is then dried. In FIG. 8C, a second capacitor dielectric layer 225 is then applied, and dried. In an alternative embodiment, a single layer of capacitor dielectric material may be deposited through a coarser mesh screen to provide an equivalent thickness in one printing.

In FIG. 8D, an electrode 230 is formed over the second dielectric layer 225 and dried. The electrode 230 can be formed by, for example, screen-printing a thick-film metallic ink. When a copper foil 210 is used in conjunction with a copper underprint 212, a copper electrode may be used. An example of a suitable copper electrode paste is EP 320 obtainable from E. I. du Pont de Nemours and Company. In general, the surface area of the dielectric layer 225 should be larger than that of the electrode 230.

The first capacitor dielectric layer 220, the second capacitor dielectric layer 225, and the electrode 230 are then co-fired. Firing may be accomplished, for example, at a peak temperature of between 850 and 950° C. in a nitrogen thick-film furnace. The thick-film capacitor dielectric layers 220, 225 may be formed of, for example, a high dielectric constant functional phase such as barium titanate, various dopants and a glass frit phase. During co-firing, the glass frit phase softens, wets the functional and dopant phases and coalesces to create a dispersion of the functional phase and the dopants in a glass-ceramic matrix. At the same time, the copper electrode powders of the layer 230 are wetted by the softened glass frit phase and sinter together to form a solid electrode.

The layer 230 has a strong bond to the high K dielectric 228 that results from the co-firing. The post-fired structure is shown in front elevation in FIG. 8E.

Figure 8F:
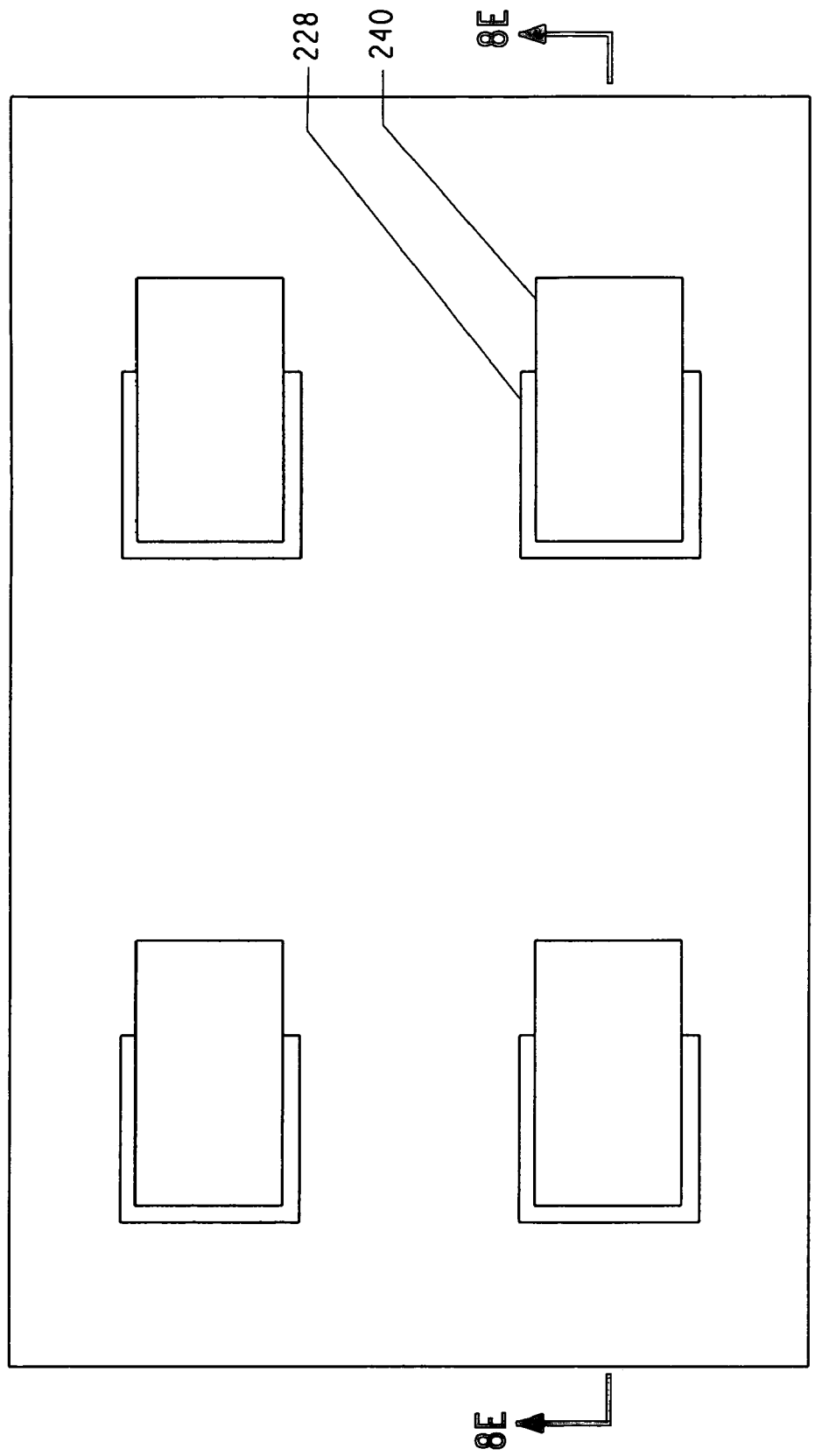

FIG. 8F is a plan view of the finished capacitor structure 200. In FIG. 8F, four capacitor 240 structures on the foil 210 are illustrated. Any number of capacitor structures 240, in various patterns, however, can be arranged on a foil 210.

In the formed-on-foil capacitor discussed in this specification, the term "paste" or "ink" may correspond to a conventional term used in the electronic materials industry, and generally refers to a thick-film composition. Typically, the metal component of the underprint paste is matched to the metal in the metal foil. For example, if a copper foil were used, then a copper paste could be used as the underprint. Examples of other applications would be pairing silver and nickel foils with a similar metal underprint paste. Thick film pastes may be used to form both the underprint and the passive components.

Generally, thick-film pastes comprise finely divided particles of ceramic, glass, metal or other solids dispersed in polymers dissolved in a mixture of plasticizer, dispersing agent and organic solvent. Preferred capacitor pastes for use on copper foil have an organic vehicle with good burnout in a nitrogen atmosphere. Such vehicles generally contain very small amounts of resin, such as high molecular weight ethyl cellulose, where only small amounts are necessary to generate a viscosity suitable for screen-printing. Additionally, an oxidizing component such as barium nitrate powder, blended into the dielectric powder mixture, helps the organic component burn out in the nitrogen atmosphere. Solids are mixed with an essentially inert liquid medium (the "vehicle") then dispersed on a three-roll mill to form a paste-like composition suitable for screen-printing. Any essentially inert liquid may be used as the vehicle. For example, various organic liquids, with or without thickening and/or stabilizing agents and/or other common additives, may be used as the vehicle.

High dielectric constant, (high K) thick-film capacitor dielectric pastes generally contain at least one high K functional phase powder and at least one glass powder dispersed in a vehicle system composed of at least one resin and a solvent. The vehicle system is designed to be screen-printed to provide a dense and spatially well-defined film. The high K functional phase powders may be described as powders that have bulk dielectric constant above 500 and can comprise perovskite-type ferroelectric compositions with the general formula $ABO_3$. Examples of such compositions include $BaTiO_3$; $SrTiO_3$; $PbTiO_3$; $CaTiO_3$; $PbZrO_3$; $BaZrO_3$ and $SrZrO_3$ or mixtures thereof. Other compositions are also possible by substitution of alternative elements into the A and/or B position, such as $Pb(Mg_{1/3}Nb_{2/3})O_3$ and $Pb(Zn_{1/3}Nb_{2/3})O_3$. A suitable high K functional phase powder is barium titanate obtained from Fuji Titanium. Doped and mixed metal versions of the above compositions are also suitable. Doping and mixing is done primarily to achieve the necessary end-use property specifications such as, for example, the necessary temperature coefficient of capacitance (TCC) in order for the material to meet industry definitions, such as "X7R" or "Z5U" standards.

The glasses in the pastes can be, for example, Ca—Al borosilicates, Pb—Ba borosilicates, Mg—Al silicates, rare earth borates, and other similar glass compositions. High K glass-ceramic powders, such as lead germanate ($Pb_5Ge_3O_{11}$), are preferred.

Pastes used to form the electrode layers may be based on metallic powders of either copper, nickel, silver, silver-containing precious metal compositions, or mixtures of these compounds. Copper powder compositions are preferred.

The capacitor structure described in this specification may be manufactured using multiple layers of dielectric and electrodes to increase the capacitance.

In the above example, the dielectric is described as formed by screen printing thick-film paste. Other methods however, such as deposition by solution coating, cast on copper process, or sputtering may also be used. Alternatively, a dielectric may be applied and then photo defined. In addition, the electrode layers are described as formed by screen-printing. Other methods, however, such as deposition by sputtering, plating or evaporation of electrode metals onto the dielectric layer surface may also be used. Additionally, photodefined pastes may also be used.

Figure 9A:
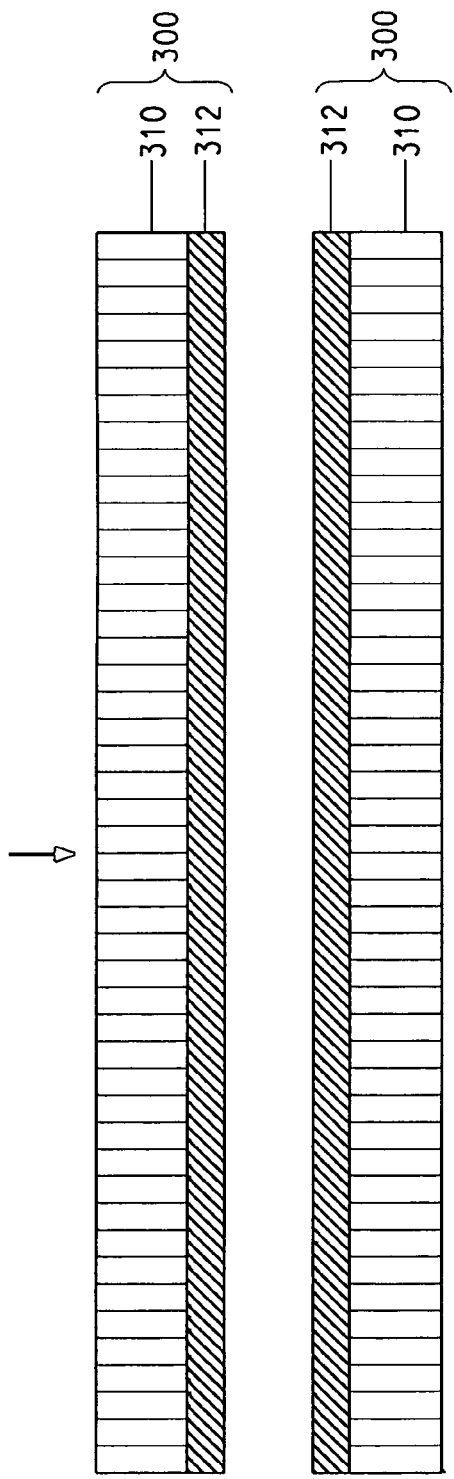
FIGS. 9A-9B illustrate a method of making a planar capacitor laminate.
Figure 9B:
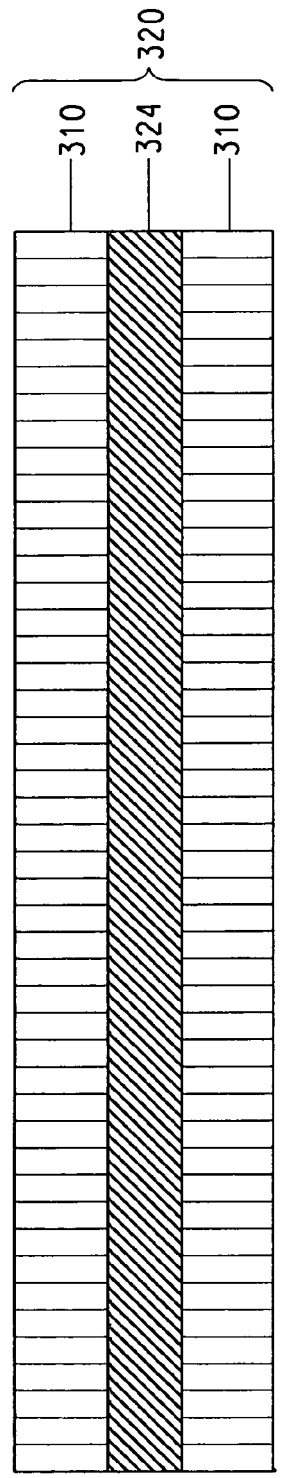

FIGS. 9A-9B illustrate, in side elevation, a general method of manufacture of a planar capacitor laminate.

FIG. 9A is a section view in front elevation of the first stage of manufacture of a planar capacitor laminate 320, illustrated in FIG. 9B, in which a first metal foil 310 is provided. The foil 310 may be made from, for example, copper, copper-based materials, and other metals. Preferred foils include foils comprised predominantly of copper, such as reverse treated copper foils, double-treated copper foils, and other copper foils commonly used in the multilayer printed circuit board industry. Examples of some suitable copper foils are those which are available from Olin Brass (Somers Thin Strip) and JEC. The thickness of the foil 310 may be in the range of, for example, about 1-100 microns, preferably 3-75 microns, and most preferably 12-36 microns, corresponding to between about ⅓ oz and 1 oz copper foil.

A slurry material or a solution may be cast or coated onto foil 310, dried and cured, forming a first dielectric layer 312, the result being a coated metal foil 300. The dielectric layer or layers of the laminate may be selected from organic, ceramic, ceramic filled organic and layers of mixtures thereof. Curing may be performed by baking, for example, at 350° C., if the slurry is of a thermoplastic nature. Higher curing temperatures can be used if the slurry is a thermoset material. Curing may be performed by drying, for example, at 120-200° C., if the polymer is intended to be only partially cured to create a "B" stage state of the polymer.

Solutions used to form the dielectric layer 312 may comprise, for example, a polymer dissolved in a solvent. Slurry materials may comprise, for example, a polymer-solvent solution with a high dielectric constant ("high K") filler/ceramic filler or functional phase. Suitable polymers for slurry or solution may include, but are not limited to, for example, epoxy or polyimide resins. High K functional phases may be defined as materials with dielectric constants of greater than 500 and may include perovskites of the general formula $ABO_3$. Suitable fillers include, for example, crystalline barium titanate (BT), barium strontium titanate (BST), lead zirconate titanate (PZT), lead lanthanum titanate, lead lanthanum zirconate titanate (PLZT), lead magnesium niobate (PMN), and calcium copper titanate. Fillers may be in powder form. A suitable high K filler phase is barium titanate obtainable from Ferro Corporation, Tam Ceramics or Fuji Titanium.

Functional phases with dielectric constants below 500 may also be appropriate for other reasons. Such materials may include the oxides of titanium, tantalum, hafnium and niobium.

If the dielectric 312 is thermoplastic in nature or only partially cured, two pieces of the coated metal foil 300 may be laminated together under heat and pressure in the direction shown by the arrows in FIG. 9A to form the laminate structure 320 illustrated in FIG. 9B.

If the dielectric 312 is thermoset in nature, a thin adhesive layer may be applied to one or both of the dielectric layers 312. Commercial thermoset dielectrics include polyimide grades available from E. I. du Pont de Nemours and Company.

Referring to FIG. 9B, lamination forms a single dielectric 324 from the layers 312. The resulting dielectric 324 can be, for example, a thin layer, on the order of 4-25 microns after lamination. One embodiment of the planar capacitor laminate is a copper-dielectric-copper laminate. Embedded capacitor materials and processes that can used to form metal-dielectric metal structures include Probelec 81 CFP from Vantico licensed to Motorola and resin coated foil products such a MCF 6000E from Hitachi Chemical Company, MR-600 from Mitsui Metal and Smelting Co., Ltd., R-0880 from Matsushita Electric Works, Ltd., and APL4000 from Sumitomo Bakelite Co., Ltd.

An alternative method of forming the dielectric 324 may be to cast a filled or unfilled thermoplastic polymer onto the foil 310 and to directly laminate a second, uncoated foil to the filled thermoplastic polymer. Yet another alternative method of manufacture includes forming the dielectric layer 324 separately as a single film and laminating it to a first foil 310 and a second foil 310 using heat and pressure. Yet another alternative method of manufacture includes forming the dielectric layer 324 separately as a single film and sputtering a metallic seed layer onto both sides of said separately formed dielectric layer and then plating additional metal onto the seed layer using electroless or electrolytic plating techniques. Suitable capacitor laminates include Interra™ HK 04 Series from E. I. du Pont de Nemours and Company, Interra™ HK 11 Series from E. I. du Pont de Nemours and Company, BC-2000 and BC-1000 from laminators licensed by Sanmina, FaradFlex Series from Oak-Mitsui Technologies, InSite™ Embedded Capacitor Series from Rohm and Haas Electronic Materials, TCC™ from Gould Electronics, and C-Ply from 3M.

Figure 10A:
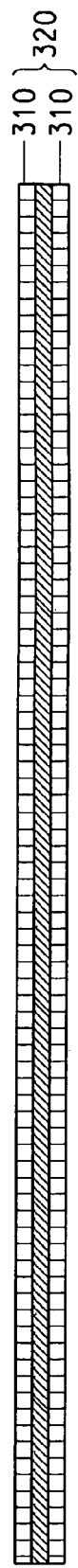
FIGS. 10A-10B illustrate initial preparation of a planar capacitor laminate for manufacture of the power core device according to the first embodiment.
Figure 10B:
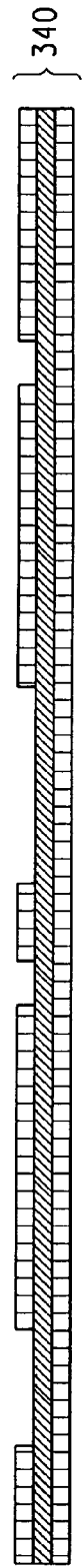

FIGS. 10A-10B illustrate, in side elevation, a general method of preparation of a planar capacitor laminate for manufacture of the power core device.

FIG. 10A shows, in side elevation, the planar capacitor laminate 320 from FIG. 9B. A photoresist (not shown in FIG. 10A) is applied to each of the foils 310. However only one of the photoresists is imaged and developed so that only one of the foils 310 is etched. All remaining photoresist is then stripped using standard printing wiring board processing conditions. An example of a suitable photoresist would be Riston® Photoresist available from E. I. du Pont de Nemours and Company.

FIG. 10B shows, in side elevation, the resulting etched laminate, 340, illustrating one side has had portions of foil 310 removed by etching while the other foil 310 remains intact.

Figure 11:
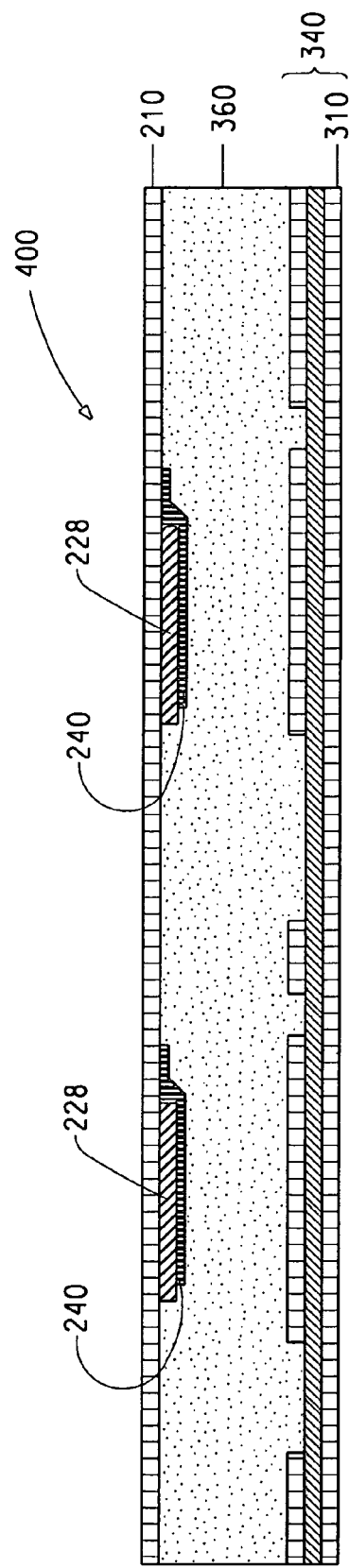
FIG. 11 is a representation in section view in front elevation of a power core structure subpart according to the first embodiment.

Referring to FIG. 11, the foil 210 containing the thick-film formed-on-foil capacitors 240 are laminated to the planar capacitor layer 340. The capacitor-on-foil structure may be inverted and the component face of the foil laminated to the etched side of the planar capacitor laminate 340 to form the power core structure subpart as shown in FIG. 11. Alternatively, the foil side of the capacitor-on-foil structure may be laminated to the etched side of the planar capacitor laminate. The lamination can be performed, for example, using FR4 epoxy prepreg 360 in standard printing wiring board processes. In one embodiment, epoxy prepreg type 106 may be used. Suitable lamination conditions may be 185° C. at 208 psig for 1 hour in a vacuum chamber evacuated to 28 inches of mercury. A silicone rubber press pad and a smooth PTFE filled glass release sheet may be in contact with the foils 210 and 310 to prevent the epoxy from gluing the lamination plates together. The dielectric prepreg and laminate materials can be any type of dielectric material such as, for example, standard epoxy, high Tg epoxy, polyimide, polytetrafluoroethylene, cyanate ester resins, filled resin systems, BT epoxy, and other resins and laminates that provide insulation. A release sheet may be in contact with the foils to prevent the epoxy from gluing the lamination plates together between circuit layers. The resulting subpart 400 is encapsulated by foil 210 on one side and foil 310 on the other.

One skilled in the art would understand that alternative designs of the power core may include laminating said singulated capacitor layer component side up to said patterned planar capacitor laminate. Such approaches would require different etching patterning and via formation to connect the appropriate layers. Alternative designs such as these may achieve the same design requirements.

Figure 12:
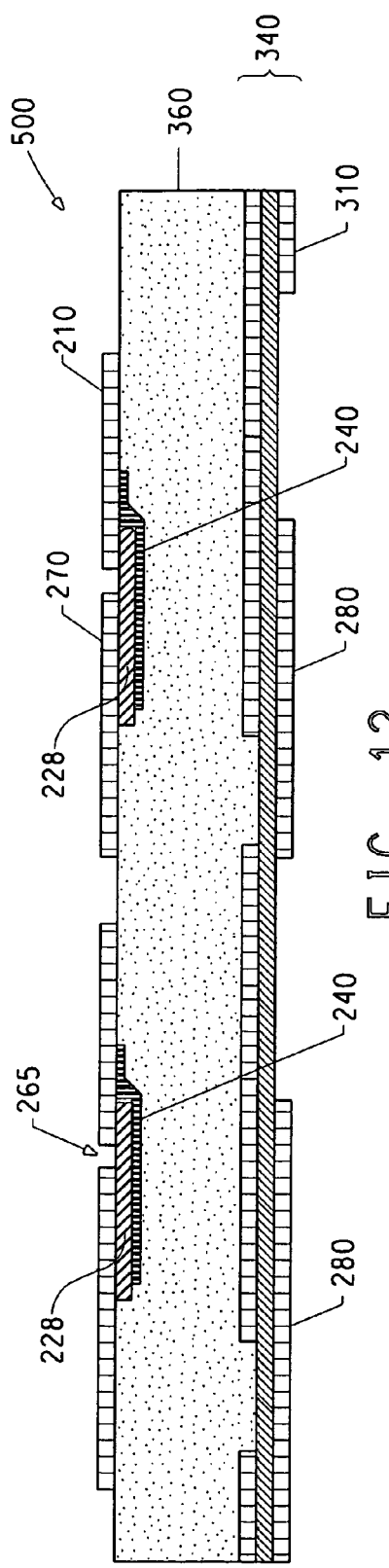
FIG. 12 is a representation in section view in front elevation of a power core structure according to the present embodiment.

Alternative etching patterns may also be used with the device embodiments as described above (i.e., face down) to yield similar electrical functions. Referring to FIG. 12, after lamination, a photo-resist is applied to the formed-on-foil capacitor foil 210 and the planar capacitor foil 310. The photo-resist is imaged, developed and the metal foils are etched and the photoresist is stripped using standard printing wiring board processing conditions. The etching produces a trench 265 in the foil 210, which breaks electrical contact between the first electrode 230 and the foil 210 creating a second electrode 270 from foil 210. Any associated circuitry is also created from foil 210 that may be used as signal circuitry. The etching also produces electrodes 280 and associated circuitry on the planar capacitor foil 310.

It should be understood that the power core 500 may include additional layers or may be formed by other sequences of lamination of layers, for example, by first laminating the imaged side of the planar capacitor laminate 340 shown in FIG. 10 to other printed wiring board layers, applying photoresist to the unimaged foil 310, etching the foil, stripping the photoresist, and then laminating the embedded singulated capacitor layer to the planar capacitor laminate.

Figure 13:
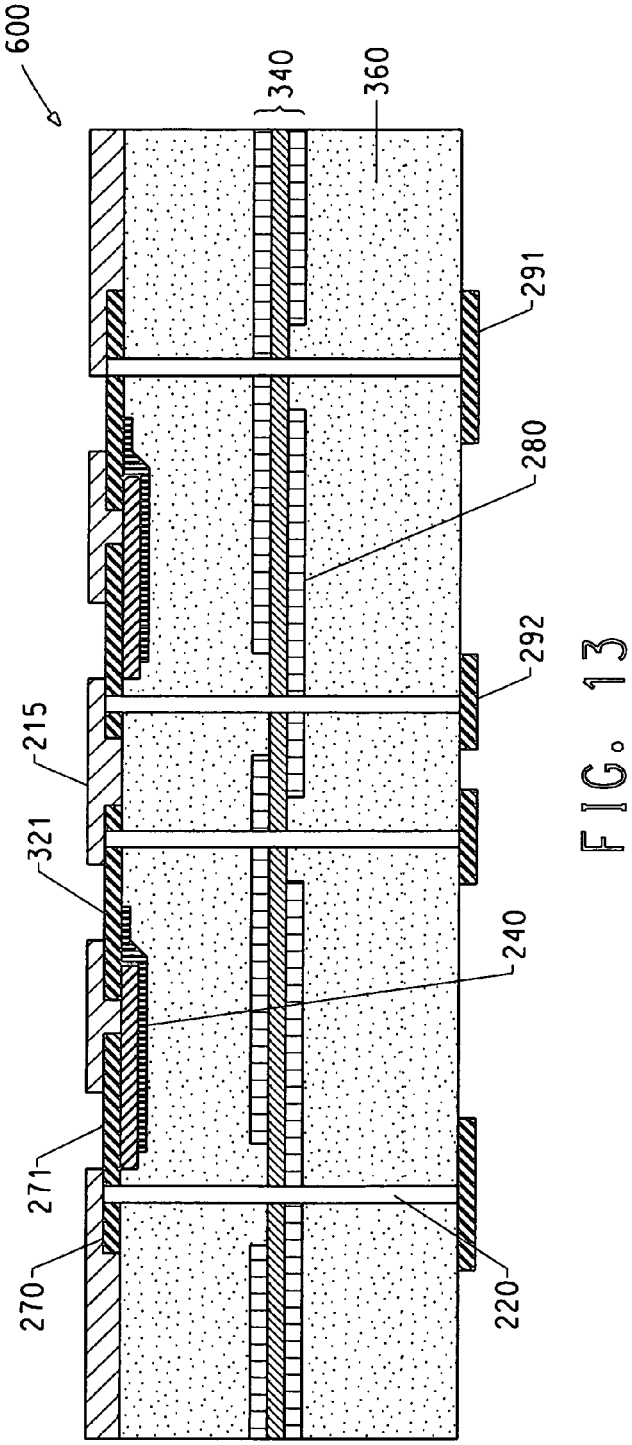
FIG. 13 is a representation in section view in front elevation of a power core device wherein an additional prepreg layer and metallic layer have been laminated to the core structure and drilled, plated through hole vias have been formed.

FIG. 13 represents a section view in front elevation after an additional laminate 360 and soldermask 215 has been added to the article shown in FIG. 12 and through holes 295 drilled and plated to result in the final embodiment of a power core device 600. The power core structure 600, comprising a planar capacitor laminate 340 and an embedded singulated capacitor 240 can be incorporated into a plurality of packages, termed "power core packages." The power core package may be a printed wiring board, IC package, module, interposer, or the like.

The power core devices of the present invention comprise a power core structure that is interconnected through at least one signal layer. The device may comprise more than one signal layer wherein the signal layers are connect through conductive vias.

Examples of vertical interconnects (via-fill, printed, etched, plated bumps) where layers are built individually and then laminated in one step may be utilized in the present invention.

The devices of the present invention may be selected from an interposer, printed wiring board, multichip module, area array package, system-on package, system-in-package, and the like.

What is claimed is:

1. A device comprising a semiconductor and a power core having an exterior surface on which the semiconductor is mounted wherein the power core comprises:

at least one embedded singulated capacitor layer containing multiple embedded singulated individual capacitors wherein said embedded singulated individual capacitors each comprise at least a first electrode and a second electrode and wherein said embedded singulated individual capacitors are positioned proximate the exterior surface of the power core with the first and second electrodes of said embedded singulated individual capacitors each including electrode pads that are exposed on the exterior surface of the power core;

at least one planar capacitor laminate embedded within the power core, wherein the at least one planar capacitor laminate has a first electrode and a second electrode, and wherein the first electrodes of said multiple embedded singulated individual capacitors are electrically connected to the first electrode of the at least one planar capacitor laminate and the second electrodes of said multiple embedded singulated individual capacitors are electrically connected to the second electrode of the at least one planar capacitor laminate, such that said embedded singulated individual capacitors are connected in parallel to said at least one planar capacitor laminate and said planar capacitor laminate serves as a low inductance path to supply a charge to said embedded singulated individual capacitors; and wherein the semiconductor has Vcc (power) terminals and Vss (ground) terminals, and Vcc (power) terminals of the semiconductor are connected to first electrodes of the multiple embedded singulated individual capacitors and Vss (ground) terminals of the semiconductor are connected to second electrodes of the multiple embedded singulated individual capacitors.

2. The device of claim 1 wherein said power core contains at least one signal layer.

3. The device of claim 1 wherein additional passive components are connected to and external to said power core.

4. The device of claim 1 wherein the first and second electrodes of said more than one embedded singulated individual capacitors are in the same plane.

5. The device of claim 1 wherein said embedded singulated individual capacitors comprise formed on foil ceramic capacitors.

6. The device of claim 5 wherein each of said embedded singulated individual formed on foil ceramic capacitors comprises a fired on foil ceramic capacitor.

7. The device of claim 1 wherein said semiconductor is a microprocessor.

* * * * *